(12) United States Patent
Colclaser et al.

(10) Patent No.: US 6,327,125 B1
(45) Date of Patent: Dec. 4, 2001

(54) INTEGRATED CIRCUIT WITH REMOVABLE ESD PROTECTION

(75) Inventors: Roy A. Colclaser; Neil Morris, both of Albuquerque, NM (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/469,874

(22) Filed: Dec. 22, 1999

(51) Int. Cl.[7] ................................................ H02H 9/00
(52) U.S. Cl. .................................................. 361/56
(58) Field of Search ........................... 361/56, 104, 111, 361/91.1, 119

(56) References Cited

U.S. PATENT DOCUMENTS

| 5,341,267 | 8/1994 | Whitten | 361/56 |
|---|---|---|---|
| 5,731,945 | 3/1998 | Bertin et al. | 361/111 |
| 5,757,590 | 5/1998 | Phipps et al. | 360/113 |
| 6,141,245 | * 10/2000 | Bertin et al. | 326/56 |

FOREIGN PATENT DOCUMENTS

0589519A2   3/1994   (EP) ................... G02F/1/136

* cited by examiner

Primary Examiner—Ronald W. Leja
(74) Attorney, Agent, or Firm—John F. Vodopia

(57) ABSTRACT

An integrated circuit includes electrostatic discharge (ESD) protection circuits coupled to protect I/O pins and or operational circuits from damage due to ESD events. The ESD protection circuits are coupled to fuses which in turn are coupled to external program pin(s) of the IC. The fuses can be opened via the external program pin(s) to substantially completely remove the capacitive loading on the I/O pins as well as any internal circuitry within the IC. The ESD circuits may protect against ESD damage during testing, packaging, shipping and installation into a system, and then be subsequently removed via the external program pins, such as upon first application of power to the IC via the system. Because fuses are used, the added capacitive loading of the deselection circuit is substantially zero and much less than active switching elements. The ESD deselection structure is beneficial for very high frequency RF circuits, where capacitive loading problems are particularly acute.

11 Claims, 2 Drawing Sheets

INTEGRATED CIRCUIT WITH REMOVABLE ESD PROTECTION

BACKGROUND OF THE INVENTION

1. Field of the Invention

The invention is in the field of integrated circuits ("ICs"), and more particularly, solves a problem posed by the inclusion of electrostatic discharge ("ESD") protection circuits within integrated circuits.

2. Description of the Prior Art

Integrated circuits are susceptible to damage when they are subjected to electrostatic discharge (ESD), more commonly known as "static electricity". While the discharge of static electricity can be a "shocking" experience for humans, the effect is usually fleeting. However, the effect on an IC can be permanent. The energy from the discharge of static electricity can be enough to vaporize conductor paths in an IC, causing the IC to be completely inoperable, to function in an unpredictable way, or to create defects which shorten the life of the IC. ESD events can occur at any time during the life of the part but most events that cause damage occur between the time that the circuit is manufactured in wafer form and the time that the circuit is physically mounted in the circuit board that connects the integrated circuit into the system where it is to be used.

ICs are usually protected from ESD damage by including extra device structures that are designed to absorb the ESD events while not causing an undue effect on the performance of the circuit. These structures can be as simple as a fuse or diode, or more complicated, such as grounded NMOS transistors or bipolar transistors in latchback configuration. For high performance, high frequency applications, the capacitance of the ESD protection circuitry can be the limiting factor on the performance of the circuit.

U.S. Pat. No. 5,731,945 (Bertin et al) discloses a multi-chip integrated structure in which various IC wafers are bonded together to form a single unitary structure. Conductors on side surfaces of the wafers electrically couple the circuits on adjoining wafers. Bertin discloses how to disconnect redundant circuitry in individual wafers of the bonded pre-encapsulated structure, including redundant ESD protection to reduce the overall capacitive loading. Bertin indicates that in some instances, only one ESD circuit need be coupled in circuit to provide ESD protection for the entire multi-wafer bonded IC structure. Bertin discloses the use of fuses, antifuses, etching techniques, and focused ion beam personalization for ESD customization prior to packaging of the multi-wafer structure. Bertin further discloses the use of active circuitry, such as transistor pass gates, to selectively decouple ESD protection from I/O nodes after an IC has been packaged and installed in a system.

A disadvantage of Bertin's structure is that deselection of ESD circuits by fusing and selective wiring is done after the wafers are bonded to each other, but prior to encapsulation. A disadvantage of Bertins structure with respect to active circuit control is the complication of adding internal control circuitry to activate the switching transistors. Furthermore, the switching transistor, even if selected to be of low capacitance, still burdens the I/O nodes. Additionally, ESD protection and its associated loading are still provided to protect the selection node that provides the selection signal to the ESD selection transistor.

SUMMARY OF THE INVENTION

Generally speaking, according to one aspect of the invention, an integrated circuit includes an operational circuit coupled between first and second supply rails. An ESD protection circuit and fuse are also coupled in series between the supply rails. External connection pins include a first external connection pin coupled to the first rail, a second external connection pin coupled to the second rail, and a third external, program pin coupled to a node between the fuse and the ESD protection circuit. The fuse is programmable to create an open circuit between the ESD protection circuit and one of the supply rails by connecting the third program pin to an appropriate source of electric potential.

The above integrated circuit has the advantage that the ESD protection provided by the ESD protection circuit is easily disconnectable at any time after packaging of the IC is completed simply by providing a suitable electric potential at the external program pin to blow the fuse and create an open circuit. Thus, the ESD protection may remain in place during the IC's long journey from handling of the completed wafer in the IC fab area, packing and shipping to the location where the wafer will be encapsulated in an IC package and provided with external connection pins, and finally during shipping to the customer and handling by the customer to assemble the completed IC in a system. At a desired step in the assembly of the IC in the system, when significant threat of ESD damage has subsided, the customer may remove the ESD protection simply by providing an appropriate potential to the ESD program pin.

Advantageously, at the time of assembly into the system, by coupling the program pin to the connection pin coupled to the opposite rail than that to which the fuse is connected, the fuse will simply be blown the first time the power is applied in the system.

Furthermore, the technique requires only very simple structure in the IC, namely extra conductor lines and a minimal number of fuses. By keeping the conductor lines short, the extra capacitive loading imposed on the I/O pads/pins or operational circuitry after the fuses are opened is substantially zero. This structure has significantly lower capacitance than the use of active switches, such as the pass gate disclosed in Bertin. No additional ESD protection circuit is needed for the control gate of an active device to prevent the active device from inadvertently prematurely disconnecting the primary ESD circuits, as disclosed in Bertin.

Another aspect of the invention relates to ESD protection, and removal thereof, for I/O paths of the IC. In this embodiment, the IC includes a pair of fuses each coupled to a respective supply rail and a pair of ESD protection circuits for each pin coupled in series with the fuses (see FIG. 1). An I/O connection pin is coupled between the first and second ESD protection circuits and a fourth external, program pin is coupled to the second fuse. The first and second fuses are programmable to create an open circuit between each respective supply rail and the respective ESD protection circuit by coupling each of the third and fourth program pins to appropriate potentials, to thereby eliminate loading of the I/O pin by the first and second ESD protection circuits. Favorably, any further I/O pins which have ESD protection have their ESD protection circuits coupled between the first and second fuses so that all ESD protection circuits are disconnected when the first and second fuses are opened. Thus, all ESD circuits coupled to the output pins are removed with only two extra pins and two fuses.

These and other object, features and advantages of the invention will become apparent with reference to the following detailed description and the drawings.

DESCRIPTION OF THE PREFERRED EMBODIMENTS

Figure 1:
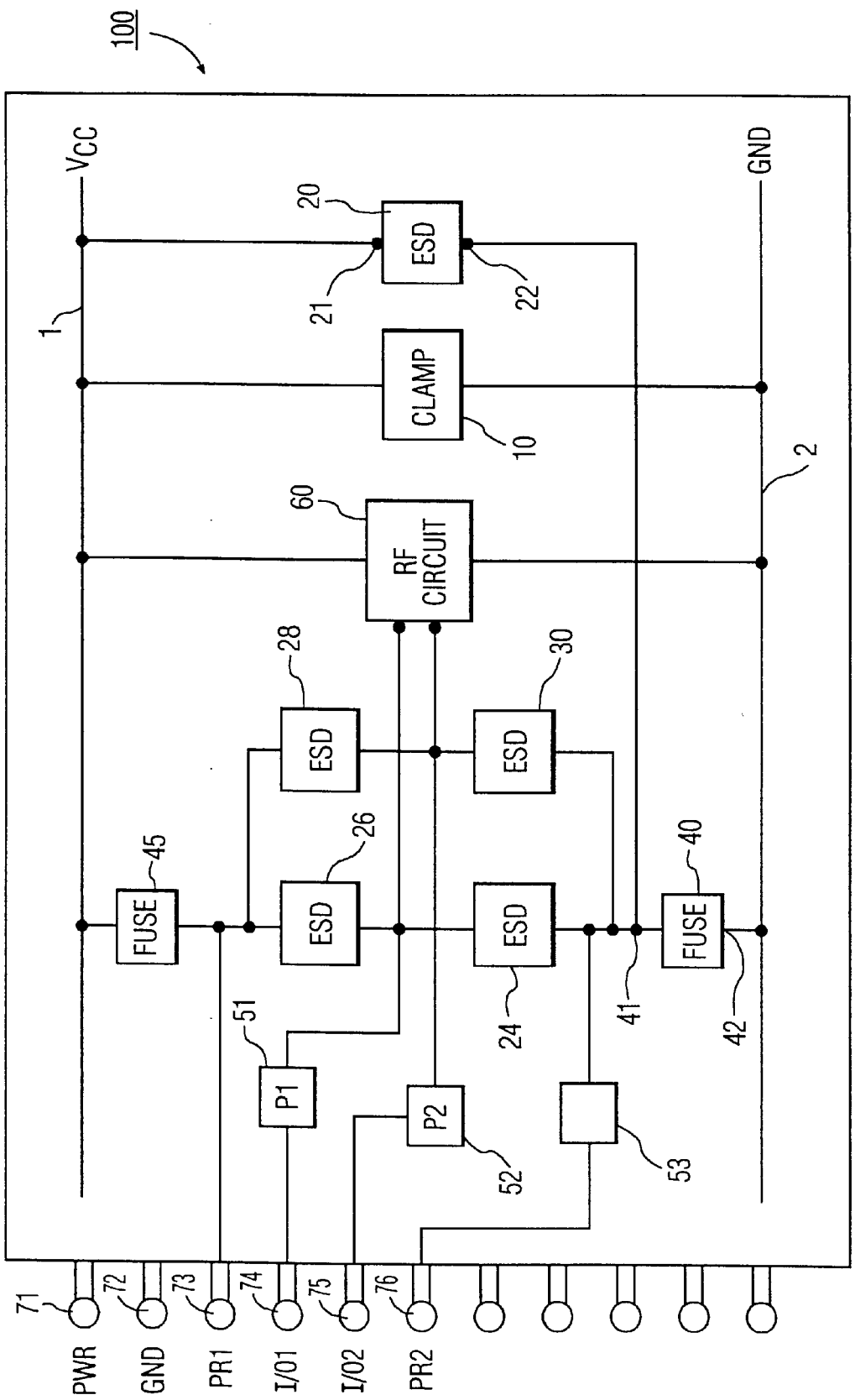
FIG. 1 illustrates a block diagram of an IC illustrating several aspects of the invention.

FIG. 1 illustrates a block diagram of an IC 100 employing ESD disconnection techniques according to the invention. The IC has a first power supply rail 1 and a second, lower supply rail 2 normally provided with a lower electric potential than rail 1. Rail 1 may be provided with a voltage Vcc and rail 2 be coupled to ground potential, for example. Coupled between these rails is an operational circuit 10. The operational circuit 10 in this example is a power supply clamp. A first ESD protection circuit 20 is coupled between the supply rails to protect the operational circuit 10 against damage from electrostatic discharge. The ESD protection circuit 20 has one terminal 21 coupled to the first supply rail and a second terminal 22 coupled to one end 41 of a fuse 40, the other end 42 of which is coupled to the second rail. As used herein, a fuse is an element which in a first unprogrammed state is a short-circuit and which in a second, programmed state is irreversibly converted to an open circuit by passing an appropriate current through the element. An ESD connection pad 53 is coupled to the fuse end 41 which is not coupled to the second rail. Furthermore, the rail 1 is connected to a first external connection pin 71 (PWR) of the IC 100, the second rail to a second external connection pin 72 (GND), and the ESD pad 53 is coupled to a third external, program pin 76 (PR2).

During fabrication, testing, packaging and shipping, the fuse 40 remains in the unprogrammed (conductive) state. The operational circuit 10 then is protected by the ESD protection circuit 20, as the fuse is still conductive. Generally, prior to assembly in the system, pin 76 will either be connected to the pin 72, which is coupled to the second rail (generally ground) so that both ends of the fuse are at the same potential, or merely left floating. In general, leaving the pin floating is safe except in those cases where the fuse is designed to be blown at very low current, where an ESD event itself could blow the fuse. Upon installation in a system in which the IC will be used, the ESD protection may then be removed by programming the fuse 40 to render it non-conductive. The fused is programmed simply by applying a potential to the external program pin 76 which will cause a sufficient current to flow through fuse 40 to the second supply rail, causing the fuse to "blow". Generally, this just requires connecting pin 76 to the connection pin 71 which is coupled to the supply rail 1. In this way, the ESD protection circuit 20 is removed the first time power is applied to the IC after installation in a system. Alternatively, power could be applied to pin 76 from a separate source other than by connection to pin 71. For example, a separate supply from that in the system could be used at some point in the fabrication of the system to blow the fuse 20 after significant risk of ESD damage in the system assembly is over.

FIG. 1 further illustrates disconnectable ESD protection for input/output pins that are particularly sensitive. I/O connection pads 51, 52 are coupled in this case to external connection I/O pins 74, 75 (I/O1, I/O2) which serve to receive input signals, provide output signals generated within circuits of the IC, or both. In this case, the I/O connection pads are coupled to RF circuit 60, for example a transceiver for a CDMA mobile handset. Coupled in series between the supply rails 1, 2 are a first fuse 40, a second ESD protection circuit 24, a third ESD protection circuit 26, and a second fuse 45. Also connected in series between the first and second fuses are fourth and fifth ESD protection circuits 28, 30. I/O connection pad 51 is coupled to a node between the ESD protection circuits 24, 26 and the I/O connection pad 52 is coupled to a node between the ESD protection circuits 28, 30.

For an operational circuit 10, an ESD event will occur between the two supply rails. Consequently, it is desired to discharge the ESD event in a path parallel to the circuit 10, which discharge path is provided by ESD device 20. For the I/O pins, however, an ESD event can occur between an I/O pin (74,75) and either of the first and second supply rails 1, 2 via the circuit 60, or even between two I/O pins. Thus, an ESD circuit (and consequently a respective fuse) is needed between an I/O pin and each of the first and second supply rails as has been illustrated in FIG. 1.

For ESD devices (second through fifth protection circuits) 24,26,28,30, as for first ESD protection circuit 20, the fuses 40, 45 are left in the unprogrammed state while there is danger of ESD damage, such as during testing, packaging and shipping. After installation in a system, when it is desirable to remove all unnecessary loading on the I/O pads 51, 52, the fuses 40, 45 are programmed to create an open circuit and electrically disconnect the ESD protection circuits 20, 24, 26, 28, 30 from these I/O pins 74, 75. This would be accomplished by connecting an external supply to program pin 76 to create a current through fuse 40 to create an open circuit, and another external supply to program pin 73 to create an open circuit at fuse 45. The ESD protection circuits are then disconnected and impose very minimal capacitive loading on the I/O pads 51, 52.

It should be noted that either or both of the above disconnection schemes can be present on the IC. In FIG. 1 in which both schemes are present, note that all ESD protection circuits are decoupled by opening just the two fuses 40, 45.

Figure 2A:
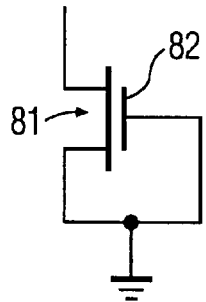
FIGS. 2(a)–2(d) illustrate several circuit devices which can be used as power supply clamps and/or ESD protection devices.
Figure 2B:
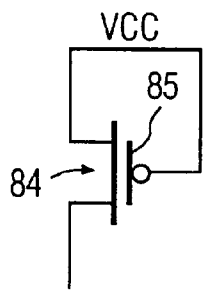
Figure 2C:
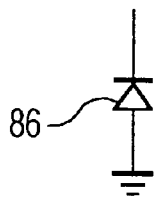
Figure 2D:
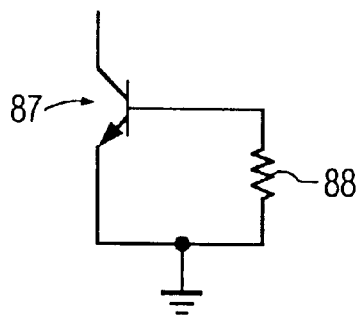

Generally, ESD protection circuits should appear as an open circuit in normal circuit function, and act as a discharge path only for ESD events. FIG. 2 illustrates several circuit elements which can be used for ESD protection and/or as a power supply clamp 10. FIG. 2(a) shows an NMOS transistor 81 with a grounded gate 82. FIG. 2(b) is an inactive PMOS transistor 84 with a gate 85 coupled at the same potential as the drain, in this case Vcc. FIG. 2(c) is a diode which serves as one type of ESD protection device of FIG. 1. FIG. 2(d) is a latchback NPN bipolar transistor 87 with a resistor 88 coupled from the base to the emitter of the transistor 87.

The diode of FIG. 2(c) can be used as ESD protection elements 20, 24, 26, 28, 30 in FIG. 1, if either the grounded gate NMOS of FIG. 2(a) or the latchback NPN of FIG. 2(d) are used as a power supply clamp 10 (and with an ESD device 20). The diodes are connected with the cathode coupled to the first supply rail. Diodes acting as ESD devices 24, 26 function as follows. If an ESD event occurs at I/O pin 74 which is negative relative to pin 72 (ground), it is discharged through diode 24. If the ESD event is positive relative to ground, it is discharged through diode 26, through clamp 10 (or ESD device 20) back to ground. If an ESD event at pin 74 is positive relative to pin 71 (Vcc), it is discharged through a forward biased diode 26 to the higher supply rail 26. If negative relative to pin 71, the ESD event is discharged through clamp 10 (or ESD device 20) and diode 24. For ESD events between I/O pins 74,75, if pin 74 is positive relative to pin 75, it is discharged through diode 26, clamp 10 and then diode 30. If pin 74 is negative relative to pin 75, the ESD is discharged in the opposite direction through these circuit elements.

The grounded gate NMOS of FIG. 2(a) is often used for ESD elements 24, 30 in conjunction with the use of the diode of FIG. 2(c) or the inactive PMOS device of FIG. 2(b) for the ESD devices 26, 28. The grounded gate NMOS will go into a known "snap back" mode, allowing an ESD event to discharge from pin 74 to the lower supply rail 2. Similarly, an inactive PMOS device used for devices 26, 28 will breakdown to carry the ESD event. The latchback NPN bipolar transistor of FIG. 2(a) is often used for ESD elements 24, 30, usually with the diode of FIG. 2(c) for ESD elements 26, 28.

The devices of FIG. 2 illustrate some of the circuit devices which can be used for ESD protection. Other devices which perform in an analogous fashion may also be used.

Generally speaking, as technology allows ICs to get smaller, it is more difficult to protect ICs against ESD events, since the conductive paths become smaller and are more easily damaged. Thus, ESD protection schemes must become more robust, which generally entails larger devices (area) and greater capacitive loading. ESD protection techniques presently known to the inventors are suitable for circuits which operate in the 1–2 GHz range, but are expected to impose too high of a capacitive load for next-generation RF circuits for which operation above 10 GHz, and more particularly in the 30–40 GHz range is desired. Decoupling by active devices such as a pass gate will not be effective, as this type of device provides capacitance from gate to supply to ground, forming an unacceptable link for the signal. By contrast, disconnection of the ESD devices by a fuse element substantially eliminates capactive coupling of the ESD devices and the fuses themselves. Thus, when fuses are configured to be programmed via external connection pins of a completed (packaged) IC as in the present invention, the benefits of maintaining full ESD protection until the IC is placed in a system (as provided by a pass gate or other active circuit element in known devices) are retained, while the drawbacks of such active circuit elements (complexity, capacitive loading) are eliminated.

The process or technology by which the of the invention is made is not important and any of the standard bipolar, CMOS or BiCMOS processes can be used.

Although preferred embodiments of the present invention have been shown and described, it will be appreciated by those skilled in the art that changes may be made in these embodiments without departing from the principles and spirit of the invention, the scope of which is defined in the claims.

The many features and advantages of the invention are apparent from the detailed specification and it is intended by the appended claims to cover all such features and advantages which fall within the true spirit and scope of the invention. Since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. An integrated circuit, comprising:

a first supply rail and a second, lower supply rail;

an operational circuit coupled between said supply rails;

a first ESD protection circuit and a fuse coupled in series between said first and second supply rails;

a first external connection pin coupled to said first supply rail;

a second external connection pin coupled to said second, lower supply rail;

a third external, program pin coupled to a node between said fuse and said first ESD protection circuit, said fuse being programmable to create an open circuit between said first ESD protection circuit and one of the supply rails by connecting said program pin to an appropriate source of electric potential.

2. An integrated circuit according to claim 1, wherein said fuse is coupled between said second supply rail and said program pin, and said fuse is selected to be programmable by coupling said program pin to said first pin and applying power to the IC.

3. An integrated circuit according to claim 1, wherein said operational circuit is a power supply clamp.

4. An integrated circuit according to claim 1, wherein said integrated circuit further comprises:

a second fuse and second and third ESD protection circuits, said second and third ESD protection circuits being coupled in series between said first and second fuses, and said first and second fuses being coupled to respective ones of said first and second supply rails;

an external I/O connection pin coupled between said second and third ESD protection circuits; and a fourth external, program pin coupled to said second fuse, said first and second fuses being programmable to create an open circuit between each respective supply rail and the respective ESD protection circuit by coupling each of said third and fourth connection pins to appropriate potentials, to thereby eliminate loading of said external I/O pin by said second and third ESD protection circuits.

5. An integrated circuit according to claim 4, further comprising:

a plurality of additional external I/O connection pins; and a plurality of pairs of ESD protection circuits, wherein each pair is constructed to cooperate with each of said plurality of additional I/O connection pins and is coupled in series between said first and second fuses, and each one of said additional I/O connection pins is coupled between the ESD protection circuits of a respective said pair of ESD protection circuits such that all I/O connection pins are isolated from each corresponding path of ESD protection circuits upon opening of said first and second fuses.

6. An integrated circuit according to claim 4, wherein said operational circuit comprises an RF circuit coupled to said I/O connection pin and at least one of (i) receiving and (ii) transmitting an RF signal across said I/O pin.

7. A method of controlling loading of circuit elements in integrated circuits having ESD protection circuits, said method comprising:

forming an integrated circuit on a substrate;

providing an ESD protection circuit and a fuse coupled in series between first and second supply rails on the substrate;

encapsulating the integrated circuit and providing a first external connection pin coupled to the first supply rail, a second external connection pin coupled to the second supply rail, and a third external, program pin coupled to a node between the fuse and the ESD protection circuit; and removing the loading on circuit elements in the integrated circuit by coupling the program pin to a source of potential to create an open circuit at the fuse between the ESD protection circuit and one of the supply rails.

8. A method according to claim 7, wherein said removing step is carried out after assembling the integrated circuit in a system.

9. A method according to claim 7, comprising:

wherein said fuse is coupled between said second supply rail and said program pin, and said fuse is selected to be programmable by coupling the program pin to the first pin and applying power to the first and second external connection pins.

10. A method according to claim 7, further comprising:

providing a second fuse and a second ESD protection circuit, the first and second ESD protection circuits being coupled in series between said first and second fuses, and said first and second fuses being coupled to respective ones of the supply rails;

providing an I/O connection pin coupled between the first and second ESD protection circuits;

providing a fourth, external program pin coupled to the second fuse, and coupling each of the third and fourth program pins to appropriate potentials to create an open circuit between each respective supply rail and the respective ESD protection circuit, to thereby eliminate loading of the I/O pin by the first and second ESD protection circuits.

11. A method according to claim 9, further comprising:

providing a plurality of I/O connection pins; and providing a plurality of pairs of ESD protection circuits, each pair being coupled in series between the first and a second fuse coupled to said first external connection pin at its first end and each of said plurality of pairs of ESD protection circuits; and coupling each one of said I/O connection pins between the ESD protection circuits of a respective pair of ESD protection circuits such that all I/O connection pins are isolated from each corresponding path of the ESD protection circuits upon opening of the first and second fuses.

* * * * *